(12) United States Patent
Shim

(10) Patent No.: US 7,567,459 B2
(45) Date of Patent: Jul. 28, 2009

(54) METHOD OF MEASURING A CHANNEL BOOSTING VOLTAGE IN A NAND FLASH MEMORY DEVICE

(75) Inventor: Keon Soo Shim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/697,198

(22) Filed: Apr. 5, 2007

(65) Prior Publication Data

US 2007/0247911 A1 Oct. 25, 2007

(30) Foreign Application Priority Data

Apr. 6, 2006 (KR) ............... 10-2006-0031445
Mar. 21, 2007 (KR) ............... 10-2007-0027645

(51) Int. Cl.
*G11C 16/04* (2006.01)

(52) U.S. Cl. ................ 365/185.17; 365/185.18; 365/185.21

(58) Field of Classification Search ............ 365/185.18, 365/185.17, 185.21
See application file for complete search history.

(56) References Cited

U.S. PATENT DOCUMENTS 7,269,068 B2 * 9/2007 Chae et al. ............ 365/185.18

2004/0190338 A1 * 9/2004 Lee ............ 365/185.05

FOREIGN PATENT DOCUMENTS

KR 10-2005-0108148 A 11/2005
KR 1020050108976 A 11/2005

* cited by examiner

*Primary Examiner*—Amir Zarabian
*Assistant Examiner*—Fernando N Hidalgo
(74) *Attorney, Agent, or Firm*—Townsend and Townsend and Crew LLP

(57) ABSTRACT

In a method of measuring a channel boosting voltage, a threshold voltage of a pass disturbance is measured in accordance with change of a pass voltage applied to a selected cell under the condition that the pass voltage having a certain level is provided to a cell not selected of erased cells. Subsequently, a threshold voltage of a program disturbance is measured in accordance with change of the pass voltage applied to the cell not selected under the condition that a program voltage having a certain level is provided to a cell selected of the erased cells. Then, the channel boosting voltage is measured by using a pass bias voltage applied when the threshold voltage of the pass disturbance is identical to that of the program disturbance. As a result, the channel boosting voltage is accurately monitored when a program operation is performed. Accordingly, a program disturbance characteristic may be easily detected, and also yield and fail may be easily analyzed.

23 Claims, 4 Drawing Sheets

METHOD OF MEASURING A CHANNEL BOOSTING VOLTAGE IN A NAND FLASH MEMORY DEVICE

CROSS-REFERENCE TO RELATED APPLICATIONS

This application claims priority from Korean Patent Application No. 2006-31445, filed on Apr. 6, 2006 and Korean Patent Application No. 2007-27645, filed on Mar. 21, 2007, the contents of which are incorporated herein by reference in its entirety.

BACKGROUND OF THE INVENTION

The present invention relates to an NAND flash memory device. More particularly, the present invention relates to a method of measuring a channel boosting voltage for the purpose of estimating a program disturbance characteristic of a NAND flash memory device.

An NAND flash memory device includes a plurality of cell blocks.

The cell block has cell strings 101 and 102 where a plurality of cells for storing data are connected in series, a drain select transistor 110 connected between the cell strings 101, 102 and a bit line BL, and a source select transistor 120 connected between the cell strings 101, 102 and a common source line CSL. Here, the number of the cell strings 101 and 102 is identical to that of the bit lines BL. Accordingly, the number of each of the drain select transistors 110 and the source select transistor 120 is identical to that of the cell stings 101 and 102.

A first bias voltage is applied to a gate of a cell through a word line WL so as to operate the cell, and a second bias voltage is provided to a drain of the drain select transistor 110 through the bit line BL. In addition, a third bias voltage is applied to a source of the source select transistor 120 through the common source line CSL.

On the other hand, in the cell of the NAND flash memory device, a gate where a tunnel oxidation film, a floating gate, a dielectric film and a control gate are laminated is formed on a given area of areas of a semiconductor substrate. Additionally, a bonding section is formed on a first part of the semiconductor substrate. Here, the first part corresponds to a lower part of both sides of the gate.

To program or erase the cell, the above NAND flash memory device injects electrons in the floating gate of the cell using a FN tunneling or ejects electrons from the floating gate using the FN tunneling. Here, the erase is performed on a unit of block, and the program is performed on a selected cell.

To program a selected cell M11 in the NAND flash memory device, a program voltage of about 18V is applied to a selected word line Selected WL, and a pass voltage of about 8V is provided to a word line not selected Pass WL. Further, a ground voltage Vss is applied to a selected bit line Selected BL, and a power supply voltage Vcc is provided to a bit line not selected Unselected BL. Here, the power supply voltage Vcc is applied to a drain select line DSL, and the ground voltage Vss is provided to the source select line SSL. Moreover, the power supply voltage Vcc is applied to the common source line CSL, and the ground voltage Vss is provided to a well (bulk).

In this case, the program voltage is applied to a control gate of a cell M14 related to the bit line not selected Unselected BL. However, a channel is boosted with a voltage rate corresponding to the coupling between the program voltage, the pass voltage and a precharge voltage provided from the bit line BL.

A voltage which the boosted channel has, i.e. channel boosting voltage prevents the FN tunneling of cells related to the bit line not selected Unselected BL, thereby preventing a program disturbance.

On the other hand, a cell to which the pass voltage is applied may be programmed. This is referred to as pass disturbance. Here, the cell is one of cells related to the selected bit line Selected BL.

In FIG. 1, the cell M11 is a cell to be programmed, the cells M12 and M13 are pass disturbance cells, and the cell M14 is a program disturbance cell.

It is important to secure program disturbance characteristics in the NAND flash memory device for the development of a product.

Factors such as a program voltage, a pass voltage, a threshold voltage of a drain select transistor, a leakage current GIDL (channel leakage current), a channel capacitance, a program time, number of a program NOP, etc. affect the program disturbance characteristics.

In addition, the channel boosting voltage is determined depending on the factors. Accordingly, the program disturbance characteristics may be estimated in case that the channel boosting voltage is measured.

However, a method of measuring the channel boosting voltage does not exist in the conventional art. This is because the channel is changed from a floating state into a ground state when it is examined (or probed) in order to measure the channel boosting voltage, and so the channel boosting voltage is changed in accordance with the converted state.

That is, since the channel boosting voltage is discharged through a probe in case of connecting a probe tip so as to measure the channel boosting voltage, the channel boosting voltage is not measured until a failed bit is found in a product. Particularly, it is verified that a cell where the channel boosting voltage is reduced by a certain leakage current is existed in the NAND flash memory device only when the failed bit is found in the product. Hence, the optimization of a process may be not timely achieved.

Accordingly, the present art measures the channel boosting voltage through a simulation, and so it is difficult to predict the channel boosting voltage changed by the leakage current of the channel.

SUMMARY OF THE INVENTION

It is a feature of the present invention to provide a method of measuring a channel boosting voltage. Particularly, a threshold voltage of a pass disturbance is measured in accordance with change of a pass voltage applied to a selected cell under the condition that the pass voltage having a constant level is provided to a cell not selected of erased cells. Subsequently, a threshold voltage of a program disturbance is measured in accordance with change of the pass voltage applied to the cell not selected under the condition that a program voltage having a constant level is provided to the selected cell of the erased cells. Then, the channel boosting voltage is measured by using a pass bias voltage applied when the threshold voltage of the pass disturbance is identical to that of the program disturbance. As a result, the channel boosting voltage is accurately monitored when a program operation is performed. Accordingly, a program disturbance characteristic may be easily detected, and also yield and fail may be easily analyzed.

A method of measuring a channel boosting voltage in an NAND flash memory device according to one example embodiment of the present invention includes applying a pass bias voltage having a constant level to cells not selected of erased cells, and measuring a first threshold voltage of a selected cell of the erased cells in accordance with a level of a first pass bias voltage applied to the selected cell; applying a program bias voltage to a selected cell of the erased cells, and measuring a second threshold voltage of the selected cell in accordance with a level of a second pass bias voltage applied to cells not selected of the erased cells; detecting a second threshold voltage measured when the second pass bias voltage having the same level as a pass bias voltage applied in a program operation is applied, and detecting a level of the first pass bias voltage applied when the first threshold voltage is identical to the second threshold voltage; and measuring the channel boosting voltage by using the level of the detected first pass bias voltage.

The step of the detecting the first threshold voltage includes performing an erase operation about every memory cells; applying the pass bias voltage having a constant level to the cells not selected, and applying the first pass bias voltage to the selected cell; measuring the first threshold voltage; and changing the level of the first pass bias voltage. Here, the steps of the performing, the applying, the measuring and the changing are repeatedly performed until the level the first pass bias voltage is identical to an objective level. In this case, the first threshold voltage is a threshold voltage of the selected cell.

The step of the measuring the second threshold voltage includes performing an erase operation about every memory cells; applying the program bias voltage having a constant level to the selected cell, and applying the second pass bias voltage to the cells not selected; measuring the second threshold voltage; and changing the level of the first pass bias voltage. Here, the steps the performing, the applying, the measuring and the changing are repeatedly performed until the second pass bias voltage is identical to an objective level. In this case, the second threshold voltage is a threshold voltage of the selected cell.

The first pass bias voltage and the second pass bias voltage are applied for a time of about 30 µs to about 40 µs, and changed in the range of about 1.5V and about 14.5V.

The program bias voltage has about 21V.

The method further includes measuring a threshold voltage of the memory cells after the erase operation is performed.

The channel boosting voltage equals to the program voltage minus the detected first pass bias voltage.

As described above, in a method of measuring a channel boosting voltage, a threshold voltage of a pass disturbance is measured in accordance with change of a pass voltage applied to a selected cell under the condition that the pass voltage having a certain level is provided to a cell not selected of erased cells. Subsequently, a threshold voltage of a program disturbance is measured in accordance with change of the pass voltage applied to the cell not selected under the condition that a program voltage having a certain level is provided to a cell selected of the erased cells. Then, the channel boosting voltage is measured by using a pass bias voltage applied when the threshold voltage of the pass disturbance is identical to that of the program disturbance. As a result, the channel boosting voltage is accurately monitored when a program operation is performed. Accordingly, a program disturbance characteristic may be easily detected, and also yield and fail may be easily analyzed.

In addition, a process that a fail is expected may be accurately and early verified when a product is tested, and so a time required for developing a product and an expense may be reduced.

Further, the yield may be enhanced because the process that the fail is expected is verified before the test of the product. Moreover, since a product having fail is screened before the test, a test expense may be reduced.

DESCRIPTION OF SPECIFIC EMBODIMENTS

Figure 1:
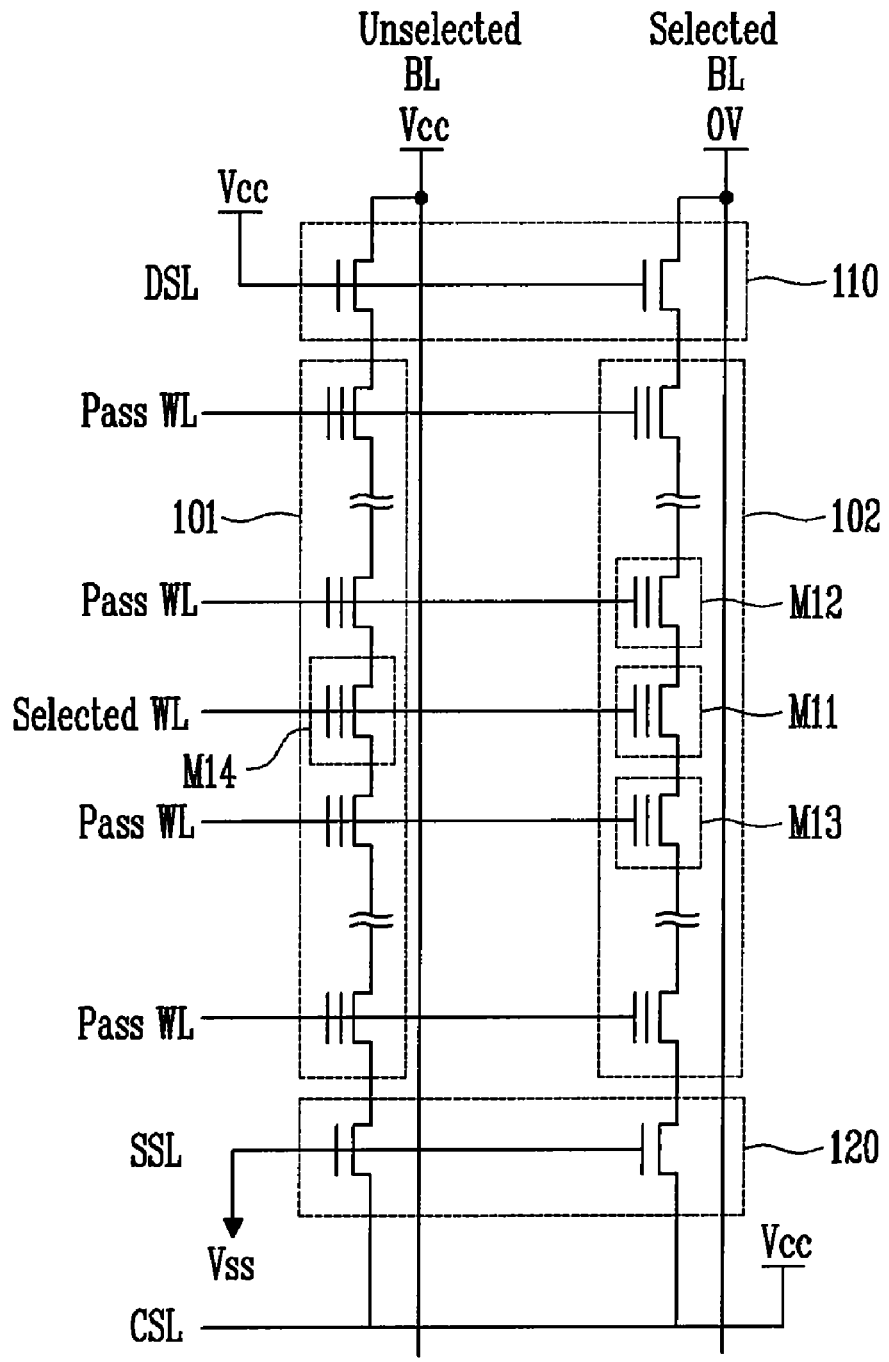
FIG. 1 is a view illustrating a circuitry related a common method of programming a cell in an NAND flash memory device.
Figure 2:
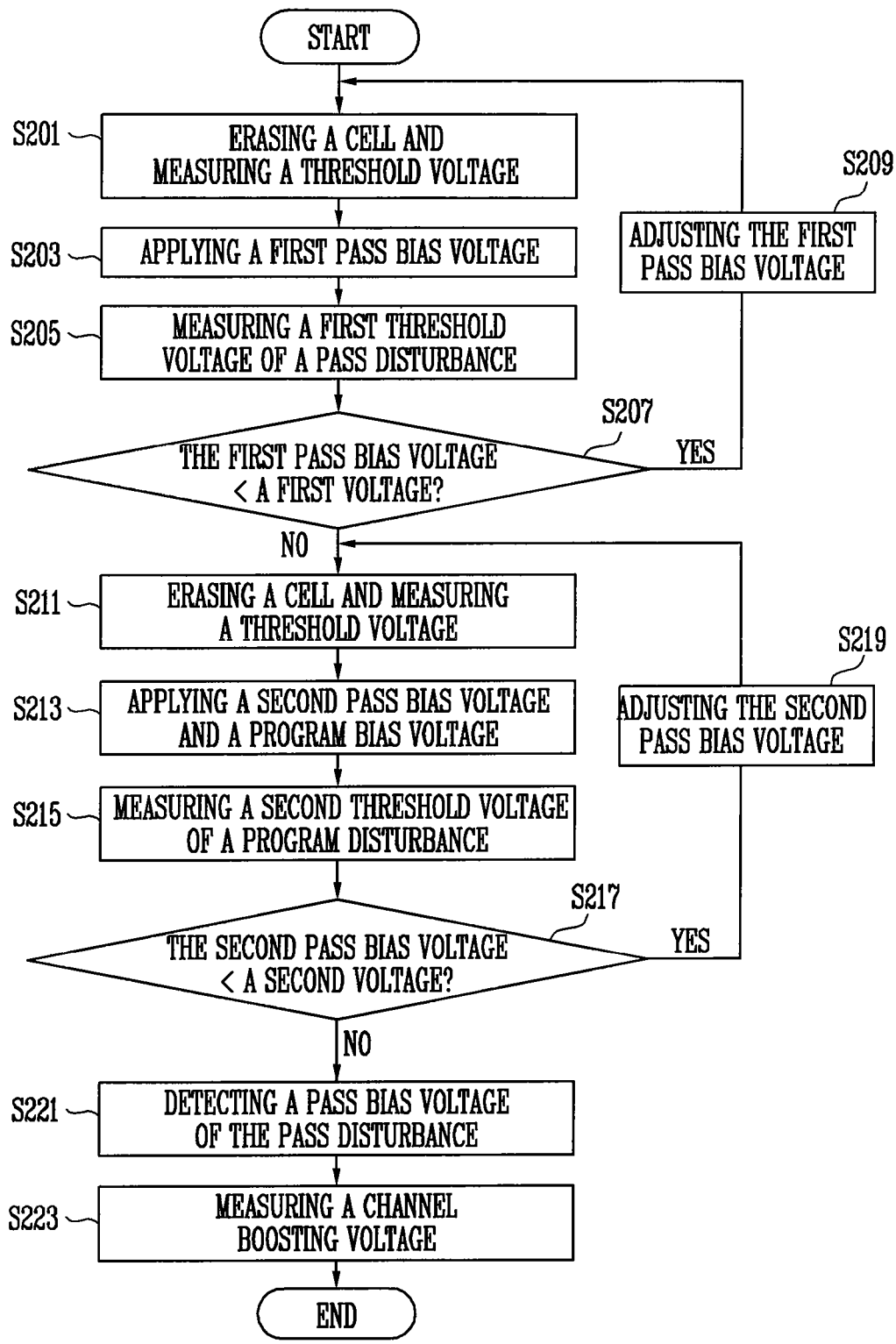
FIG. 2 is a flow chart illustrating a method of measuring a channel boosting voltage of an NAND flash memory device according to one example embodiment of the present invention.

FIG. 2 is a flow chart illustrating a method of measuring a channel boosting voltage of an NAND flash memory device according to one embodiment of the present invention.

Referring to FIG. 2, the method of measuring the channel boosting voltage includes the steps S201 to S209 of measuring a threshold voltage of a pass disturbance, the steps S211 to S219 of measuring a threshold voltage of a program disturbance, and the steps S221 and S223 of measuring the channel boosting voltage.

Hereinafter, these steps S201 to S223 will be described in detail with reference to accompanying drawings.

Process of Measuring the Threshold Voltage of the Pass Disturbance

Figure 3:
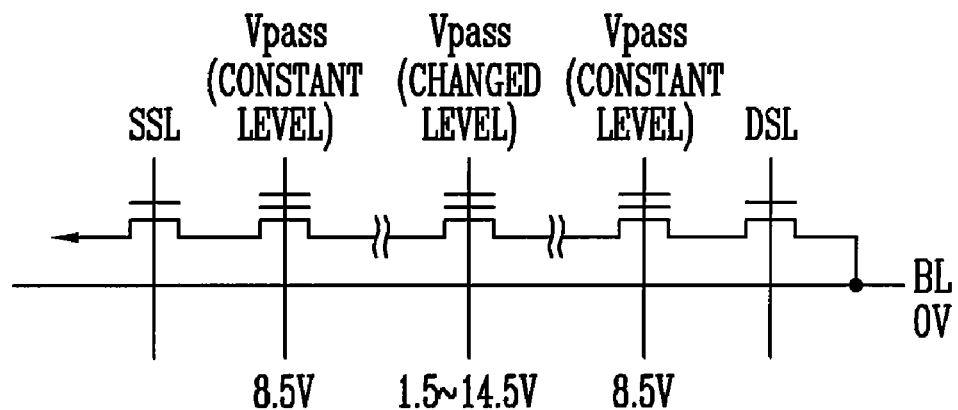
FIG. 3 is a view illustrating a circuitry related to the method of measuring the threshold voltage of the pass disturbance in the method of measuring the channel boosting voltage according to one example embodiment of the present invention.

FIG. 3 is a view illustrating a circuitry related to the method of measuring the threshold voltage of the pass disturbance in the method of measuring the channel boosting voltage according to one example embodiment of the present invention.

Referring to FIG. 2 and FIG. 3, in step of S201, an erase operation about memory cells is performed, and then a threshold voltage of erased memory cells is measured.

In step of S203, a ground voltage, e.g. 0V, is applied to a bit line BL, and a pass bias voltage having a constant level, e.g. 8.5V, is provided to cells not selected amongst those in a cell string. In addition, a first pass bias voltage is applied to cells selected amongst those in the cell string from low level, e.g. 1.5V.

In step of S205, a first threshold voltage of the selected cell is measured after a time for a common program operation, e.g., 50 µs or less, has lapsed.

In step of S207, it is determined whether or not the first pass bias voltage is increased up to a voltage (hereinafter, referred to as "first voltage"), e.g. 14.5V, required for measuring the first threshold voltage of the pass disturbance.

In step of S209, in case that the first pass bias voltage is not increased up to the first voltage, the level of the first pass bias voltage is adjusted. Particularly, the level of the first pass bias voltage is increased in a step increment of a voltage between 0.1V and 2.0V. Subsequently, the step of S201 is performed, and then the first pass bias voltage that has been changed is applied to the selected cell in step of S203. Next, the first threshold voltage of the pass disturbance is measured in step of S205, and then it is determined whether or not the first pass bias voltage is increased up to the first voltage. That is, the steps S201 to S209 are repeatedly performed until the first bias voltage is increased up to the first voltage, i.e. during the first pass bias voltage is smaller than the first voltage.

In brief, the first threshold voltage is measured with the first pass bias voltage that has been increased. However, the first threshold voltage may be measured with the first pass bias voltage that has been reduced. For example, the first threshold voltage may be measured with the first pass bias voltage that has been reduced from 14.5V to 1.5V.

That is, the first voltage as objective voltage is 1.5V. In this case, the steps S201 to S209 are repeatedly performed until the first pass bias voltage has the first voltage, i.e. during the first pass bias voltage is higher than the first voltage so that the first threshold voltage is measured.

In case that the measure of the first threshold voltage is finished, a second threshold voltage of the program disturbance is measured as described below.

Process of Measuring the Threshold Voltage of the Program Disturbance

Figure 4:
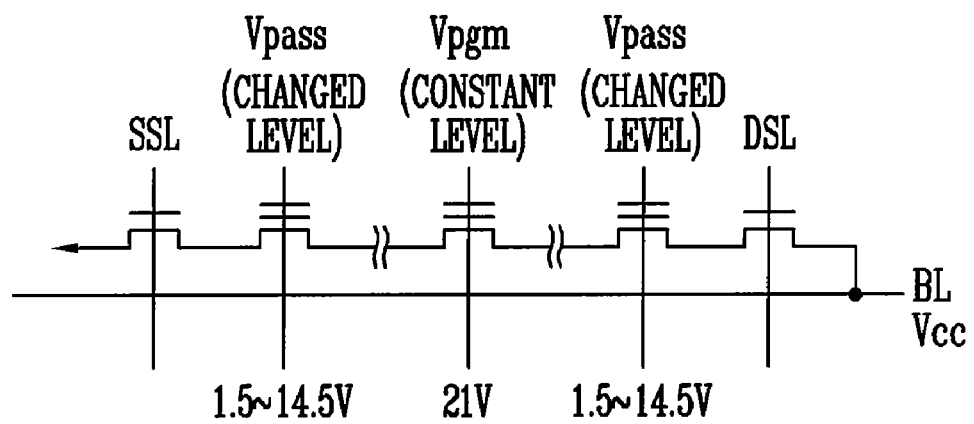
FIG. 4 is a view illustrating a circuitry related to a method of measuring the threshold voltage of the program disturbance in the method of measuring the channel boosting voltage according to one example embodiment of the present invention.

FIG. 4 is a view illustrating a circuitry related to a method of measuring the threshold voltage of the program disturbance in the method of measuring the channel boosting voltage according to one example embodiment of the present invention.

Referring to FIG. 2 and FIG. 4, in step of S211, an erase operation about memory cells is performed, and then a threshold voltage of erased memory cells is measured.

In step of S213, a power supply voltage, e.g. Vcc, is applied to a bit line BL, and a program bias voltage having a constant level, e.g. 21V, is provided to a selected cell. In addition, a second pass bias voltage is applied to a cell not selected amongst those in the cell string from low level, e.g. 1.5V. Here, the program bias voltage is applied with high voltage of about 21V so that the program disturbance about the cell is adequately performed, i.e., the cell has a threshold voltage of −2V or more.

In step of S215, the second threshold voltage of the selected cell is measured after a time for a common program operation, e.g. no more than 50 μs, has lapsed.

In step of S217, it is determined whether or not the second pass bias voltage is increased up to a voltage (hereinafter, referred to as "second voltage"), e.g. 14.5V, required for measuring the second threshold voltage of the program disturbance.

In step of S219, in case that the second pass bias voltage is not increased to the second voltage, the level of the second pass bias voltage is adjusted. Particularly, the level of the second pass bias voltage is increased in steps by a voltage between 0.1V and 2.0V. Subsequently, the step of S211 is performed, and then the second pass bias voltage having changed level is applied to the cell not selected in step of S213. Next, the second threshold voltage of the program disturbance is measured in step of S217, and then it is determined whether or not the second pass bias voltage is increased up to the second voltage. That is, the steps S211 to S219 are repeatedly performed until the second bias voltage is increased up to the second voltage, i.e., during the second pass bias voltage is smaller than the second voltage.

In short, the second threshold voltage is measured with the second pass bias voltage that has been increased. However, the second threshold voltage may be measured with the second pass bias voltage that has been reduced. For example, the second threshold voltage may be measured with the second pass bias voltage that has been reduced from 14.5V to 1.5V.

In other words, the second voltage as objective voltage is 1.5V. In this case, the steps S211 to S219 are repeatedly performed until the second pass bias voltage has the second voltage, i.e. during the second pass bias voltage is higher than the second voltage so that the second threshold voltage is measured.

In case that the measure of the second threshold voltage is finished, the channel boosting voltage is measured as described below.

Process of Measuring the Channel Boosting Voltage

Figure 5:
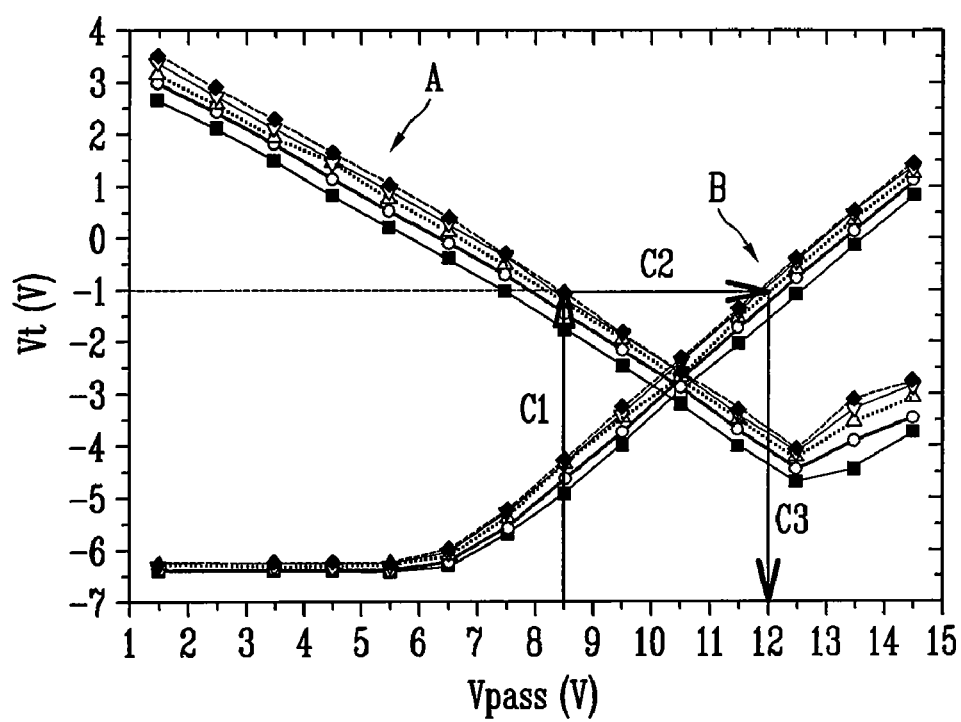
FIG. 5 is a view illustrating a graph related to the change of a threshold voltage in accordance with the pass disturbance and the program disturbance.

FIG. 5 is a view illustrating a graph related to the change of a threshold voltage in accordance with the pass disturbance and the program disturbance.

Referring to FIG. 2 and FIG. 5, a graph A indicates the change of the threshold voltage of the selected cell measured by applying the program bias voltage having 21V to a gate of the selected cell of the erased cells so as to measure the program disturbance, and applying changeably the pass bias voltage to the gates of the cells not selected. Further, a graph B illustrates the change of the threshold voltage of the selected cell measured by applying changeably the pass bias voltage to the gate of the selected cell of the erased cells so as to measure the pass disturbance, and applying the pass bias voltage having constant level to the gate of the cells not selected.

In step of S221, a threshold voltage when the pass bias voltage having the same level as a pass bias voltage applied in a real program operation is provided is detected through the graph A related to the program disturbance, and the pass bias voltage applied at a threshold voltage having the same level as the detected threshold voltage is detected through the graph B related to the pass disturbance.

In particular, in C1, the threshold voltage when the pass bias voltage having the same level as the pass bias voltage applied in the real program operation is provided is detected through the graph A.

For example, in case that the pass bias voltage in the real program operation is 8.5V, the detected threshold voltage is −1V.

Additionally, when the threshold voltage is −1V (in C2) in an operation of detecting the threshold voltage characteristic of the pass disturbance, an applied pass bias voltage is detected in C3. Here, the pass bias voltage of the pass disturbance applied when the threshold voltage is −1V has 12V.

In step of S223, in case that the pass bias voltage is measured through the pass disturbance characteristic, the channel boosting voltage is measured by using the measured pass bias voltage. In this case, the channel boosting voltage equals to the program bias voltage minus the detected pass bias voltage. Here, the program bias voltage means a voltage applied to the selected cell so as to detect the threshold voltage characteristic of the program disturbance.

Further, the second threshold voltage of the program disturbance equals to the program bias voltage minus the channel boosting voltage. In this case, since the first threshold voltage of the pass disturbance equals to the pass bias voltage minus 0V, the channel boosting voltage corresponds to the difference of the program voltage and the detected pass bias voltage in case that the first threshold voltage has the same level as the program bias voltage.

For example, when the pass bias voltage detected through the graph B has about 12V, the channel boosting voltage has the program bias voltage of 21V minus the pass bias voltage of 12V, i.e., 9V.

When the threshold voltage is −1V, a range in which the pass bias voltage is changed is increased in case that the pass bias voltage is not detected through the pass disturbance characteristic so that the pass bias voltage is augmented up to higher level. Then, the steps S201 to S219 are again performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of measuring a channel boosting voltage in a NAND flash memory device, the method comprising:
    applying a pass voltage to unselected memory cells, and applying a first pass voltage to a selected memory cell in an erase state;
    measuring a first threshold voltage of the selected memory cell when a level of the first pass voltage applied to the selected memory cell is changed;
    applying a program voltage to the selected memory cell, and applying a second pass voltage to the unselected memory cells;
    measuring a second threshold voltage of the selected memory cell when a level of the second pass voltage applied to the unselected memory cells is changed;
    detecting a level of the second threshold voltage that has been measured when the second pass voltage having the same level as a pass bias voltage applied in a program operation is applied to the unselected memory cells, and detecting a level of the first pass voltage that has been applied to the selected memory cell when the first threshold voltage is identical to the second threshold voltage; and
    measuring the channel boosting voltage by using the level of the detected first pass voltage and a level of the program voltage.

2. The method of claim 1, wherein the program voltage is 21V.

3. The method of claim 1, wherein the step of the measuring the first threshold voltage includes:
    measuring the first threshold voltage of the selected memory cell; and
    increasing the level of the first pass voltage,
    wherein the steps of the measuring and the increasing are repeated when the first pass voltage is smaller than an objective level.

4. The method of claim 3, wherein the objective level is 14.5V.

5. The method of claim 3, wherein the first pass voltage and the second pass voltage are applied for a time of 30 μs to 40 μs.

6. The method of claim 3, wherein the first pass voltage and the second pass voltage are changed in the range of 1.5V and 14.5V.

7. The method of claim 1, further comprising:
    performing an erase operation on all memory cells in a block before applying the pass voltage; and
    measuring a threshold voltage of the memory cells after the erase operation is performed.

8. The method of claim 1, wherein the step of the measuring the first threshold voltage includes:
    measuring the first threshold voltage of the selected memory cell; and
    reducing the level of the first pass voltage,
    wherein the steps of the measuring and the increasing are repeatedly performed when the first pass voltage is higher than an objective level.

9. The method of claim 8, wherein the objective level is 1.5V.

10. The method of claim 8, wherein the first pass voltage and the second pass voltage are applied for a time of 30 μs to 40 μs.

11. The method of claim 8, wherein the first pass voltage and the second pass voltage are changed in the range of 1.5V and 14.5V.

12. The method of claim 1, wherein the step of the measuring the second threshold voltage includes:
    measuring the second threshold voltage of the selected memory cell; and
    increasing the level of the second pass voltage,
    wherein the steps the measuring and the increasing are repeatedly performed when the second pass voltage is smaller than an objective level.

13. The method of claim 12, wherein the objective level is 14.5V.

14. The method of claim 13, wherein the first pass voltage and the second pass voltage are applied for a time of 30 μs to 40 μs.

15. The method of claim 12, wherein the first pass voltage and the second pass voltage are changed in the range of 1.5V and 14.5V.

16. The method of claim 12, wherein the program voltage is 21V.

17. The method of claim 1, further comprising:
    performing an erase operation on all memory cells in a block before applying the second pass voltage; and
    measuring a threshold voltage of the memory cells after the erase operation is performed.

18. The method of claim 1, wherein the step of the measuring the second threshold voltage includes:
    measuring the second threshold voltage of the selected memory cell; and
    reducing the level of the second pass voltage,
    wherein the steps the measuring and the increasing are repeated when the second pass voltage is higher than an objective level.

19. The method of claim 18, wherein the objective level is 1.5V.

20. The method of claim 18, wherein the first pass voltage and the second pass voltage are applied for a time of about 30 μs to about 40 μs.

21. The method of claim 18, wherein the first pass voltage and the second pass voltage are changed in the range of 1.5V and 14.5V.

22. The method of claim 18, wherein the program voltage is 21V.

23. The method of claim 1, wherein the channel boosting voltage is equal to the program voltage minus the detected first pass voltage.

* * * * *